(12) United States Patent
Kampasi et al.

(10) Patent No.: US 11,691,378 B2
(45) Date of Patent: Jul. 4, 2023

(54) BEND INDUCIBLE SELF-FOLDING ORIGAMI FLEXURES AND MICROSYSTEMS

(71) Applicant: Lawrence Livermore National Security, LLC, Livermore, CA (US)

(72) Inventors: Komal Kampasi, San Francisco, CA (US); Eric B. Duoss, Danville, CA (US); Razi-Ul Muhammad Haque, San Francisco, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 0 days.

(21) Appl. No.: 17/402,676

(22) Filed: Aug. 16, 2021

(65) Prior Publication Data

US 2023/0048543 A1    Feb. 16, 2023

(51) Int. Cl.
| | |
|---|---|
| *B32B 27/08* | (2006.01) |
| *B32B 3/30* | (2006.01) |
| *B32B 7/027* | (2019.01) |
| *B32B 7/023* | (2019.01) |
| *B32B 7/025* | (2019.01) |
| *B32B 27/28* | (2006.01) |

(52) U.S. Cl.
CPC ............... *B32B 3/30* (2013.01); *B32B 7/023* (2019.01); *B32B 7/025* (2019.01); *B32B 7/027* (2019.01); *B32B 27/08* (2013.01); *B32B 27/281* (2013.01)

(58) Field of Classification Search
CPC ........... B32B 3/30; B32B 7/023; B32B 7/025; B32B 7/027; B32B 27/08; B32B 27/281
See application file for complete search history.

(56) References Cited

PUBLICATIONS

Liu, Ying, et al. "Three-dimensional folding of pre-strained polymer sheets via absorption of laser light." Journal of Applied Physics 115, 20 (2014): 204911. https://doi.org/10.1063/1.4880160.

Mishra, Suvrajvoti , et al. "Advances in Piezoelectric Polymer Composites for Energy Harvesting Applications: A Systematic Review." Macromolecules Materials and Engineering 304, No. 1 (2019): 1800463.

Chen, Luzhuo, et al. "High-Performance, Low-Voltage, and Easy-Operable Bending Actuator Based on Aligned Carbon Nanotube/Polymer Composites." ACS Nano 5.3 (2011): 1588-1593.

Segalman, D. J., et al. "Theory and Application of Electrically Controlled Polymeric Gels." Int. Journal of Smart Material and Structures 1.1 (1992): 95.

(Continued)

*Primary Examiner* — Lawrence D Ferguson
(74) *Attorney, Agent, or Firm* — Harness, Dickey & Pierce, P.L.C.

(57) ABSTRACT

The present disclosure relates to a spatio-temporal stimulus responsive foldable structure. The structure may have a substrate having at least a region formed to provide engineered weakness to help facilitate bending or folding of the substrate about the region of engineered weakness. The substrate is formed to have a first shape. A stimulus responsive polymer (SRP) flexure is disposed at the region of engineered weakness. The SRP flexure is responsive to a predetermined stimulus actuation signal to bend or fold in response to exposure to the stimulus actuation signal, to cause the substrate to assume a second shape different from the first shape.

14 Claims, 7 Drawing Sheets

(56) References Cited

PUBLICATIONS

Jayaneththi, Vinura R., Kean C. Aw and Andrew J. McDaid. "Wireless magnetic polymer actuator for implantable applications." 2017 IEEE International Conference on Advanced Intelligent Mechatronics (AIM), IEEE, 2017, pp. 791-796 doi: 10.1109/AIM.2017.8014114.

Fahrni, F., M. W. J. Prins, and L. J. Van IJzendoorn. "Magnetization and actuation of polymeric microstructures with magnetic nanoparticles for application in microfluidics." Journal of Magnetism and Magnetic Materials 321.12 (2009): 1843-1850.

Origami Cube

Origami PNI

| Actuation | Stimuli | SRPs or Smart Polymers |
|---|---|---|
| Contraction or Expansion | Light/Heat/Water | Polyurethanes, PMMA (with colored dyes for light responsiveness) |
| Contraction or Expansion; osmotic gradient | Electric Field | Piezoelectric polymers like polyvinylidene fluoride, polylactic acid, cellulose and their composites [9]; carbon nanotubes-polymer (polydimethylsiloxane) matrix [10]; Ionic metal-polymer composites (IMPCs) made of fluoropolymer-based ionomers like nafion [11] |
| Contraction or Expansion | Magnetic Field | Magnetic polymer composites (MPCs) consisting of an elastomer matrix (such as silicone rubber, PDMS, etc) and magnetic fillers (such as Fe304 or magnetic nanoparticles) [12, 13] |
| Volume Expansion | Fluid/Water | Hydrogels like Collagen |

BEND INDUCIBLE SELF-FOLDING ORIGAMI FLEXURES AND MICROSYSTEMS

FEDERALLY SPONSORED RESEARCH OR DEVELOPMENT

This invention was made with Government support under Contract No. DE-AC52-07NA27344 awarded by the United States Department of Energy. The Government has certain rights in the invention.

FIELD

The present disclosure relates generally to the controlled bending and folding of a material, also known as "Origami", and more particularly to structures having a substrate with one or more stimulus responsive flexures formed thereon, where the substrate is susceptible to bending and folding at predetermined regions of engineered weakness, such that the flexure(s) can be used to controllably bend or fold the substrate into a predetermined shape when a predetermined stimulus is used to actuate the flexure(s).

BACKGROUND

The statements in this section merely provide background information related to the present disclosure and may not constitute prior art.

Origami is an ancient art of folding pieces or sheets of material, for example sheets of paper, into complex shapes and objects, typically without any cuts, and without using any glues, adhesives or the like. Up until the present time, little effort has been made to apply Origami principles to modern day manufacturing techniques to produce sheet-like components that are able to be controllably folded or shaped, during a subsequent manufacturing or installation operation, into a new, predetermined, non-planar shape or 3D configuration.

Relatively recent advances in additive manufacturing techniques have provided the ability to create 2D and 3D structures with sub-micron size features. While this technology has proven tremendously useful in producing components for use in a wide variety of industries, especially those connected with the medical field, current 3D printing technologies are somewhat limited to use with certain types of materials. In addition, a 3D printed part provides no access to inner cavities within the part once the 3D manufacturing process is finished. Nor do present day 3D printing technologies generally allow for controlled modifications to a shape or configuration of a 3D printed structure after the 3D printing operation is complete.

While the advantages of 3D printing techniques and the knowledge of traditional Origami principles are well recognized, little work has been done to leverage and combine the benefits of 3D manufacturing techniques with those of traditional microfabrication to produce lithographically patterned sheet-like or planar structures and parts which can then be 3D printed and folded at a later time. More particularly, little or no work has been done to attempt to produce a microscale 3D geometry which is responsive to a predetermined external stimulus signal, so as to be selectively folded or shaped into a predetermined, high resolution 3D shape, such as may be needed for a high precision biocompatible structure, such as an implantable probe, during a subsequent implantation or installation process.

SUMMARY

This section provides a general summary of the disclosure, and is not a comprehensive disclosure of its full scope or all of its features.

In one aspect the present disclosure relates to a spatio-temporal stimulus responsive foldable structure. The structure may comprise a substrate having at least a region formed to provide engineered weakness to help facilitate bending or folding of the substrate about the region of engineered weakness. The substrate may be formed to have a first shape. A stimulus responsive polymer (SRP) flexure may be included which is disposed at the region of engineered weakness. The SRP flexure is responsive to a predetermined stimulus actuation signal to bend or fold in response to exposure to the stimulus actuation signal, to cause the substrate to assume a second shape different from the first shape.

In another aspect the present disclosure relates to a self-folding structure. The structure may comprise first and second substrate sections having electrically conductive components formed thereon, and an external stimulus-responsive polymer flexure supported on the first and second substrate sections. The external stimulus-responsive polymer flexure forms a depth-differentiated stimuli response gradient responsive to an external stimulus to induce the first and second substrate sections to fold relative to each other about a hinge axis therebetween, into a three dimensional configuration. The electrically conductive components are actuated to their respective functional positions in a three dimensional configuration of the structure.

In still another aspect the present disclosure relates to a method of forming a 3D structure. The method may include forming a planar or planar-like substrate with at least one region of engineered weakness designed to facilitate bending or folding of the substrate. The method may further include forming a stimulus responsive polymer (SRP) flexure disposed on the substrate at the region of engineered weakness, the SRP flexure being responsive to a predetermined stimulus actuation signal which creates a stress within the SRP flexure when exposed to the predetermined stimulus actuation signal. The method may further include applying the predetermined stimulus actuation signal to the SRP flexure to cause the substrate to form a non-planar, three-dimensional shape.

These and other implementations and various features and operations are described in greater detail in the drawings, the description and the claims.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

FIG. 11b shows the flexure of FIG. 10 being actuated to produce an even further degree bending in the substrate which causes the substrate to assume a reverse curvature from which it started from;

DETAILED DESCRIPTION

Example embodiments will now be described more fully with reference to the accompanying drawings.

The present invention is generally directed to systems and methods which employ spatio-temporally responsive flexures disposed on one or more substrates to create controlled bending or folding of a two-dimensional (2D) sheet, for example a 2D polymer sheet, into complex, high-resolution, three-dimensional (3D) shapes. This is accomplished by the use of Stimuli Responsive Polymer (SRP) flexures which are selectively located on flexible or rigid substrates, and applying an external predetermined stimulus to cause the SRP flexures to fold or bend. The external stimulus may take a wide variety of predetermined types of stimulus, for example, light having one or more predetermined intensities and/or wavelengths, heat, magnetic field, electric fields, or even liquids. Two or more types of the just-mentioned stimuli may also be used in combination, depending on the needs of a particular application. In this manner, the present invention integrates established techniques of microfabrication and additive, manufacturing, and leverages their benefits for development of high-resolution origami microsystems which are suitable for use a wide range of applications, and particular in medical and biomedical applications, such as in connection with implantable, high-density 3D neural interfaces.

Similar to origami, the present invention operates to fold lithographically fabricated micro-systems and nano-systems, where folding itself can be programmed by material design, SRP flexure location and construction, and the engineered construction of the substrate alone with one or more areas or regions of engineered weakness, such that the folding or bending can be executed sequentially in a hands-free manner. Folding of 2D substrates into 3D structures is particularly compelling because of the potential of using materials that are lithographically patternable, biocompatible, flexible or rigid, low-cost and lightweight. The present invention provides a simple solution for controlling time, scale, direction, and the sequence of folding lithographically defined high-resolution 2D substrates with the use of external stimuli.

Figure 1:
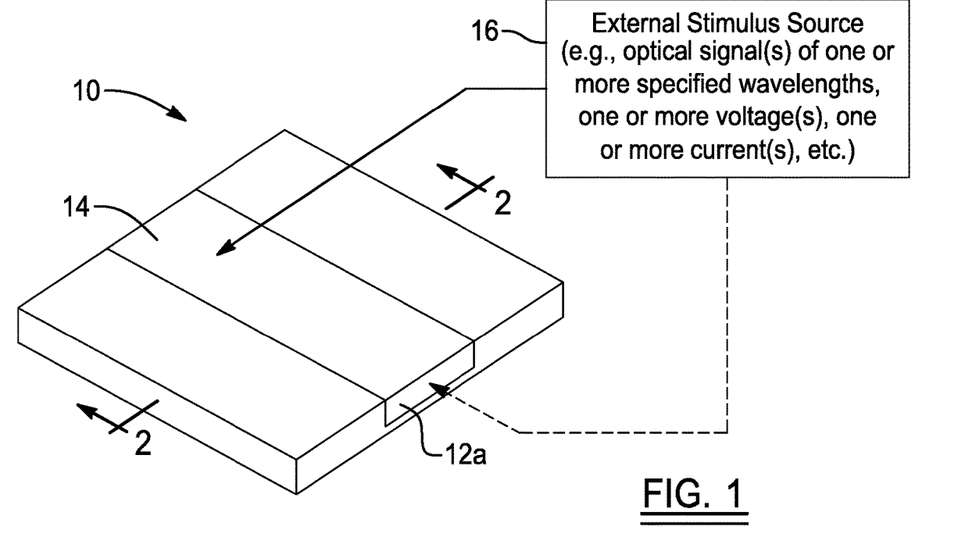
FIG. 1 is a perspective view of one embodiment of a spatio-temporal, stimulus responsive foldable structure in accordance with the present disclosure.

Turning now to the drawings, FIG. 1 shows a perspective view of one example embodiment of a spatio-temporal, external stimulus responsive, controllably foldable 3D structure 10 (hereinafter simply "structure 10"). In this example the structure 10 includes a substrate 12 having what may be termed an "engineered weakness" section 12a, and at least one spatio-temporal, stimulus responsive polymer (SRP) flexure 14 disposed on in the engineered weakness section 12a. During a subsequent actuation operation, an external stimulus actuation signal from a stimulus source 16 may be applied to the flexure 14 to actuate it. The stimulus actuation signal may be an optical signal or signals having one or more differing intensities or wavelengths, a voltage signal or signals, a current signal or signals, a thermal signal, a magnetic field or electric field signal, a fluid signal, or any other suitable form of stimulus actuation signal that the flexure 14 is responsive to. If an electrical current or voltage signal is used as the external stimulus actuation signal, then typically two electrical connections will be made to the flexure 14, whereas the use of other forms of stimulus signals (e.g., optical, thermal, magnetic field, etc.) may not require any physical connection to the flexure. The external stimulus actuation signal will, however, interact in a predetermined fashion with the flexure 14, the engineered weakness 12a and the overall construction of the substrate 12 to cause a controlled, predetermined bending or folding of the substrate 12 about the region of the engineered weakness 12a when the external stimulus actuation signal is applied.

As will become apparent from the following figures and description, the section of engineered weakness 12a where the flexure 14 is located may form a groove or channel on a surface of the substrate 12, or it may be formed between portions of the substrate such that it forms a gap which fully separates two or more sections of the substrate. Alternatively, the entirety of the substrate 12 may be formed with an engineered weakness to facilitate bending or folding uniformly over its full area, or optionally only along one or more select regions thereof. Combinations of different constructions of engineered weakness (e.g., shapes of grooves or channels) may be employed on the substrate 12 to meet the needs of a specific application.

Still further, the substrate 12 may be formed with one or more sections or regions which are generally non-flexible, such as from silicon, or from other semiconductor materials such as oxides and nitrides, glass or even ceramics. Alternatively, one or more sections of the substrate 12 may be formed with an increased thickness or a reduced thickness, to either impede bend or to facilitate a more gradual bending over a desired subregion of the substrate.

It will also be appreciated that a wide variety of present-day manufacturing techniques and technologies may be used to fabricate the substrate 12. These may include one or more of the deposition of substrate material using MEMS techniques such as spin-and-cure, chemical vapor deposition (CVD) or atomic layer deposition (ALD). The substrate 12 can also be formed or patterned using lithography or dry or wet chemical etching. Still further manufacturing techniques may include adhesion treatment of the substrate followed by definition and patterning of the SRP flexures using MEMS patterning techniques such as spin-and-cure, vapor deposition or additive manufacturing techniques such as DIW, stereolithography, two-photon polymerization (2PP), etc.

Figure 2:
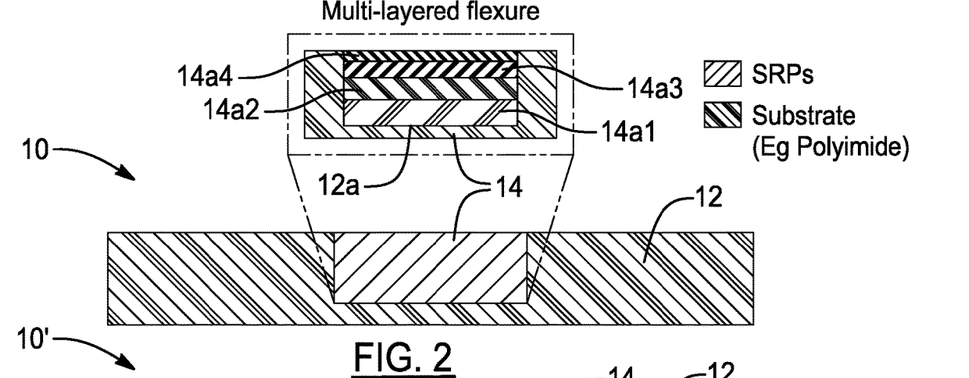
FIG. 2 is an end cross sectional view of a portion of the structure of FIG. 1 taken in accordance with section line 2-2 in FIG. 1, and also showing an enlarged portion of a multi-layer stimulus responsive material forming a multi-layer flexure embedded in an engineered groove in a substrate of the structure.

FIG. 2 shows an enlarged illustration of one embodiment of the flexure 14. The flexure 14 in this example forms a multilayer "stack" made up of a plurality of layers 14a1, 14a2, 14a3 and 14a4 of different film or film-like materials. However, the number of layers used to form the flexure 14 may vary according to the needs of a specific 3D structure being formed and the degree of bending or folding movement that is needed. In one embodiment the layers 14a1-14a4 of the flexure are "depth differentiated", meaning that the tendency or ease with each layer 14a1-14a4 is induced to bend or fold in response to an external stimulus actuation signal is engineered to either increase or decrease the tendency of the layer to bend or fold along a depth dimension of the flexure 14.

The material layers 14a1-14a4 may be all formed from the same material or from different materials, and may have the same thickness or differing thicknesses. Each layer 14a1-14a4 may be formed as a solid layer or as a geometric pattern, or may have one or more materials (e.g., metal, patterned metal, polymer composites, carbon nanotubes or shape-change metals) included therein in a desired pattern.

The construction of the flexure 14, its dimensions, as well as the shape of the engineered weakness 12a and the construction (i.e., thickness, materials, number of layers, etc.) of the substrate 12, all determine how the flexure 14 folds or bends the substrate 12, as well as its degree of bending or folding motion, as well as a degree of stimulus needed to actuate the bending or folding action. The flexure 14 thus acts similar to a hinge about which adjacent portions of the substrate bend or fold. Generally speaking, when exposed to a specific predetermined stimulus actuation signal, the flexure 14 will absorb energy, or even absorb liquids, if one or more liquids are used as the external stimulus, and will fold itself at the section of engineered weakness 12a of the substrate 12. By "fold itself", it is meant that the flexure 14 will cause the folding of one or more sections of the substrate 14 without any directly physically applied external force to the substrate 12 itself.

The flexure 14 may be constructed, in one example, with a precise polymer color, viscosity, and stimuli-responsiveness, where the color may be responsive to a select stimulus signal (e.g., a select wavelength of an optical signal). The final bending sequence and angles which the different portions of the substrate 12 assume when actuation is complete may be determined by one or more of the magnitude of the stimulus actuation signal, the direction of application of the stimulus actuation signal to the flexure 14, energy thresholds that different portions of the flexure 14 are responsive to, an impact of energy absorption on the folding action that occurs, the stress experienced by the substrate 12 and/or the flexure 14, and in some cases even the lifetime of the structure 10. In one embodiment the flexure 14 may also be formed in whole or part of a shape memory alloy (SMA) material to enable reversible folding/bending/deformation actions to occur in response to the application and removal of an applied external stimulus signal.

Still further, it will be appreciated that the SRP flexure 14 may be constructed as a depth differentiated flexure using only a single layer of material. This may be accomplished by doping a material being used (e.g., introducing a gradient into the material being used) to form the SRP flexible 14 SRP so that the dopant concentration diminishes, or increases, along a thickness dimension of the flexure. In this case, the dopant concentration determines the magnitude of the response when stimulated (i.e., the ease with which bending or folding occurs, as well as possibly the degree of folding that occurs). In effect, the introduced gradient of the dopant in the material (e.g., an electrical gradient), may make the material more or less translucent (light gradient), and thus more or less responsive to an applied external stimulus actuation signal.

It will also be appreciated that the actuation energy applied using the external stimulation source may have a significant effect on the degree of actuation that is accomplished. Different materials can have a different bending angle vs. actuation energy response, though the general trend is that the bending angle would increase with increase in actuation energy. Still another option may be to perform the actuation in two or more operations, for example in two steps of 90 degree bends, where one changes the position of actuation source for each actuation operation to achieve a different desired actuation response at each operation.

Still further, it will be appreciated that the type of material used for the SRP flexure 14 will typically have a large bearing on the degree of actuation that occurs (i.e., bending angle that is achieved). The amount of bending angle that can be achieved in a given polymer depends on its capacity to absorb energy while not undergoing damage. One way to introduce additional bending capacity in the SRP flexure 14 is to increase the glass transition temperature of the polymer being used. The exposure time of the applied external stimulus also may be used to influence the amount of bending that occurs. Changing the intensity of the stimulus actuation signal may influence the ultimate degree of bending. Dynamically changing the intensity of a stimulus actuation signal during an actuation operation, as well as the overall time of exposure, may also influence the final degree of bending that is achieved. This is because the final bending angle that is achieved during an actuation operation is a function of actuation energy absorbed by the polymer of the SRP flexure 14, which is in turn governed by both the type of material being used for the SRP flexure as well as the source energy being used to actuate it.

Figures 3, 4:
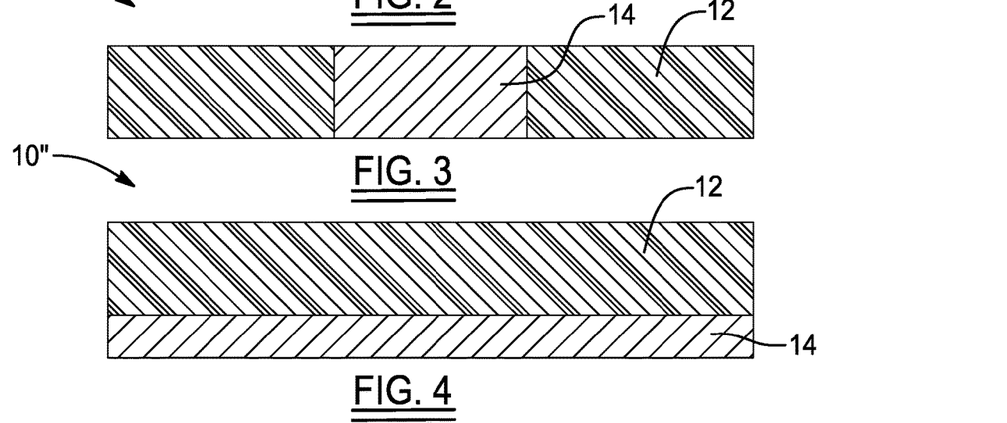
FIG. 3 is an end cross sectional view of another embodiment of a spatio-temporal, stimulus responsive foldable structure in accordance with the present disclosure in which the stimulus responsive material portion forms a flexure which extends completely through a substrate of the structure.
FIG. 4 is an end cross sectional view of another embodiment of a spatio-temporal, stimulus responsive foldable structure in accordance with the present disclosure in which the stimulus responsive material portion is placed on one planar surface of the structure.

Referring now to FIG. 3, a structure 10' is shown in accordance with another embodiment of the present disclosure. The engineered weakness 12' in the structure 10' in this example forms a full thickness opening in the substrate 12 in which the flexure 14 is positioned. The flexure 14 can be seen as having the same thickness as the substrate 12, but that need not be the case; the flexure 14 could just as readily be thinner or thicker than the substrate 14.

FIG. 4 shows yet another structure 10" in accordance with another embodiment of the present disclosure in which the flexure 14 is formed on one planar surface 12b of the substrate. The flexure 14 in this example is shown covering the entire planar surface 12b, but such is not necessary; the flexure 14 could be formed to only cover only a portion of the planar surface 12b. And while no locally defined section of engineered weakness exists with the substrate 12 in this example, the thickness, materials and overall construction of the substrate effectively impart the "engineered weakness" to the substrate 12 so that the substrate is better induced to help achieve the desired bending or folding action.

Figure 5:
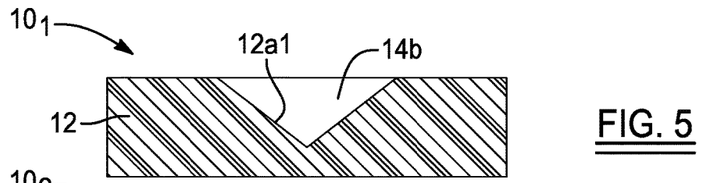
FIG. 5 is an end cross sectional view of another embodiment of a spatio-temporal, stimulus responsive foldable structure in accordance with the present disclosure in which a section of engineered weakness formed as a V-shaped notch is formed in the substrate, and the stimulus responsive material comprises a V-shape.
Figure 6:
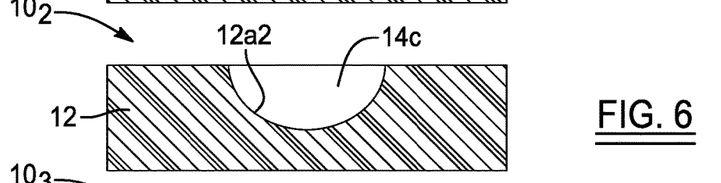
FIG. 6 is an end cross sectional view of another embodiment of the spatio-temporal, stimulus responsive foldable structure in which the engineered weakness comprises a semi-circular groove, and the stimulus responsive material comprises complementary shaped flexure.
Figure 7:
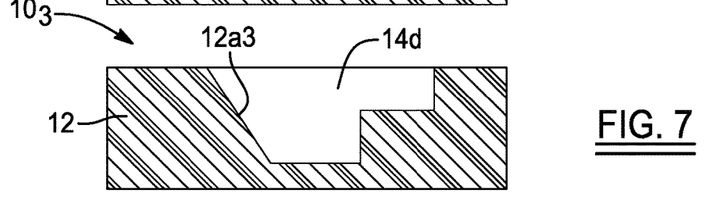
FIG. 7 is an end cross sectional view of another embodiment of the spatio-temporal, stimulus responsive foldable structure in which the engineered weakness comprises a multi-level, complex shaped groove, and the stimulus responsive material comprises a complementary shaped flexure.

FIGS. 5-7 show other structures $10_1$, $10_2$ and $10_3$ in accordance with other embodiments to illustrate how the engineered weakness section 12a may be formed with different cross-sectional shapes. One such shape is a V-shaped notch 12a1 as shown on the structure $10_1$ of FIG. 5, in which a complementary V-shaped flexure 14b is disposed. FIG. 6 shows the structure $10_2$ formed with a semi-circular notch 12a2 in which a complementary semi-circular flexure 14c is formed. FIG. 7 shows the structure $10_3$ having an irregular, multi-shaped void 12a3 in which a complementary irregular shaped flexure 14d is formed. It will be appreciated that many other variations of these shapes, as well as combinations of two or more of the these engineered weakness sections, may be used in the structure 10 to achieve a desired bending or folding action to create a desired 3D structure.

Referring now to FIGS. 8a, 8b, 9a and 9b, embodiments are shown which make use of induced tensile or compressive stresses. The term "tensile" means there is an increase in length of the object, and "compressive" means a decrease in length. Tensile or compressive strength is the capacity of a material or structure to withstand loads tending to elongate or reduce size, respectively. A given SRP flexure material's inherent stress/strain properties will define its direction of bending. Bending angle vs. actuation energy for each case will be further defined by the SRP flexure material's inherent properties such as elastic modulus, which is the measure of the stiffness of a material. Thus, it will be appreciated that the ending efficiencies for an SRP flexure which makes use of a material which experiences a tensile stress or a compressive stress during actuation may or may not be the same.

Figure 8A:
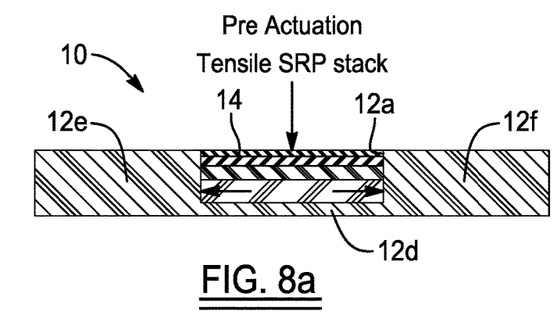
FIGS. 8a and 8b show an actuation of the structure of FIG. 2 when the flexure is designed to exert a tensile force on opposing portions of the substrate, which produces a final U-shape for the structure once actuated.
Figure 8B:
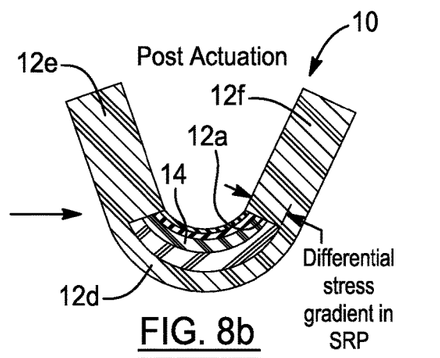

FIGS. 8a and 8b illustrate the structure 10 of FIG. 2 where the SRP flexure 14 forms a SRP multilayer flexure designed to impart a tensile differential stress gradient in the flexure, creating an expansion (i.e., tensile) force at a lower surface of the flexure 14 adjacent a thin bottom wall 12f of the substrate 12, when actuated by a predetermined external stimulus signal. This expansion force produced by the differential stress gradient effectively causes the flexure 14 to bend at the bottom wall 12d of the engineered weakness section 12a in FIG. 8a, which causes inward edges of opposing portions 12e and 12f of the substrate 12 to fold or bend upwardly and towards each other as shown in FIG. 8b into an upright, general V-shape configuration.

Figure 9A:
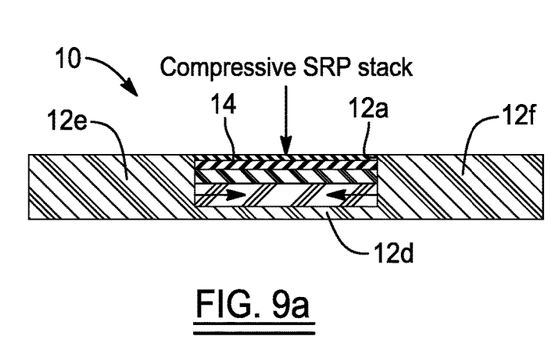
FIGS. 9a and 9b show another embodiment of the structure of FIGS. 8a and 8b but with the flexure designed to exert a compressive force on the opposing portions of the substrate, which produces a final inverted U-shape for the structure once actuated.
Figure 9B:
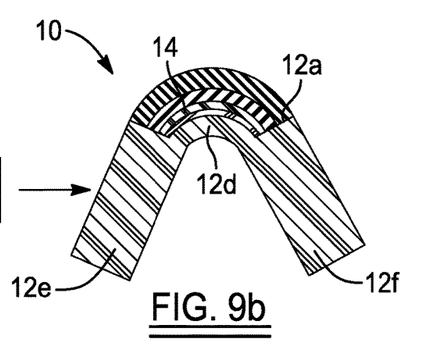

FIGS. 9a and 9b show the structure 12 but with a compressive differential stress gradient SRP stack forming the SRP flexure 14, which is designed to impart a compressive force stress at the area of engineered weakness 12a of the substrate 12 adjacent the thin bottom wall 12f. This compressive stress operates to draw the lower inward edges of the substrate portions 12e and 12f towards one another at the area of the thin bottom wall 12d, which causes the opposing portions 12e and 12f to bend downwardly and towards each other to assume an inverted V-shape, as shown in FIG. 9b.

Figure 10:
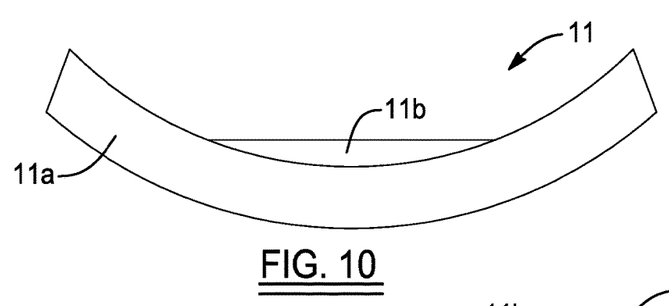
FIG. 10 shows another embodiment of the structure of FIG. 4, but where the substrate is formed as a non-planar (i.e., curved surface), and the flexure is disposed in a concave area of the surface.
Figure 11A:
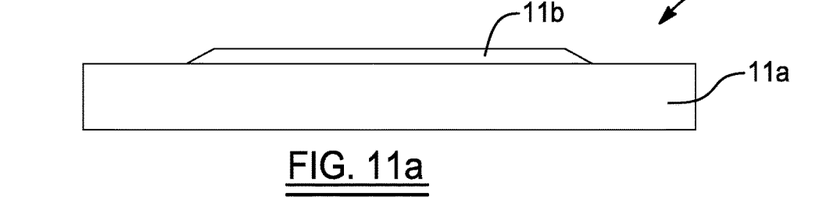
FIG. 11a shows one form of actuation of the flexure of FIG. 10 where the flexure is designed to cause a graduated tensile stress throughout its depth (i.e., thickness) which causes the substrate to be flattened when the flexure is actuated.
Figure 11B:
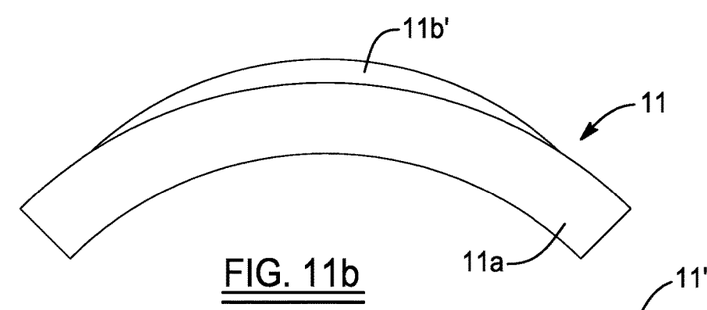

FIG. 10 shows a structure 11 in accordance with another embodiment of the present disclosure, but where a substrate 11a of the structure is formed in a non-planar (i.e., curved shape), and a differential stress gradient SRP stack forming a flexure 11b is positioned on a concave area of one surface of the substrate. FIG. 11a shows one form of actuation of the flexure 11b of FIG. 10 where the flexure is designed to cause a graduated tensile stress throughout its depth (i.e., thickness), which causes the substrate 11a to be flattened when the flexure is actuated. FIG. 11b shows the structure 11 but with a different, differential stress gradient SRP stack forming a flexure 11b', which when actuated causes the substrate 11a to assume a reverse curvature from that shown in FIG. 10.

Figure 11C:
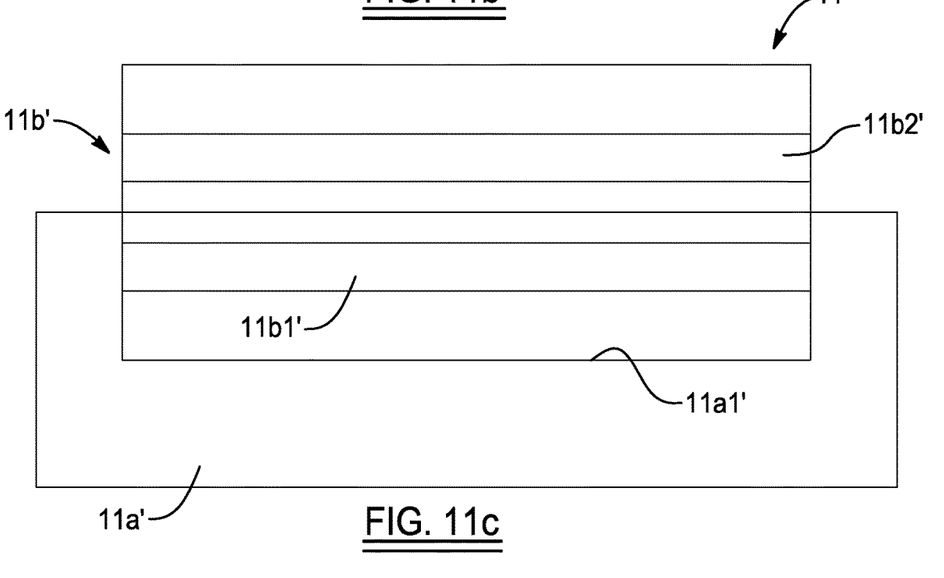
FIG. 11c shows another embodiment of a graduated stress flexure disposed partially in a section of engineered weakness of a planar substrate, where the flexure is formed to incorporate a first graduated stress portion which exerts a graduated compressive stress on the substrate, and a second graduated stress portion which exerts a graduated tensile stress on the substrate.

FIG. 11c shows a structure 11' in accordance with another embodiment of the present disclosure. The structure 11' in this example has a substrate 11a' with a section of engineered weakness 11a1' formed therein. A flexure 11b' is positioned on the substrate 11a' to be partially disposed in the section of engineered weakness 11a1', and partially outside of it. The flexure 11b' in this example forms a hybrid design in which a first portion 11b1' is formed as a differential stress gradient SRP stack which imparts a compressive stress on the substrate 11a', and a second portion 11b2' which form forms a differential stress gradient SRP stack which imparts a tensile stress on the substrate. The first and second flexure portions 11b1' and 11b2' may be actuated using any type of signal (e.g., optical, thermal, magnetic field, electrical field, fluidic signal, etc.). Optionally, the two flexure portions 11b1' and 11b2 may even be designed to be actuated by two different signals (e.g., two different thermal level signals or two optical signals of different wavelengths, etc.). The two portions 11b1' and 11b2' of the flexure 11b' may work cooperatively to cause a more extreme bending action of the substrate 11a', a more rapid bending action, or to achieve a different predetermined performance objective. The two flexure portions 11b1' and 11b2' may be actuated at the same time or at different times in response to different external conditions, which may require temporary modifications to the bent shape of the structure 11'.

Figure 18:
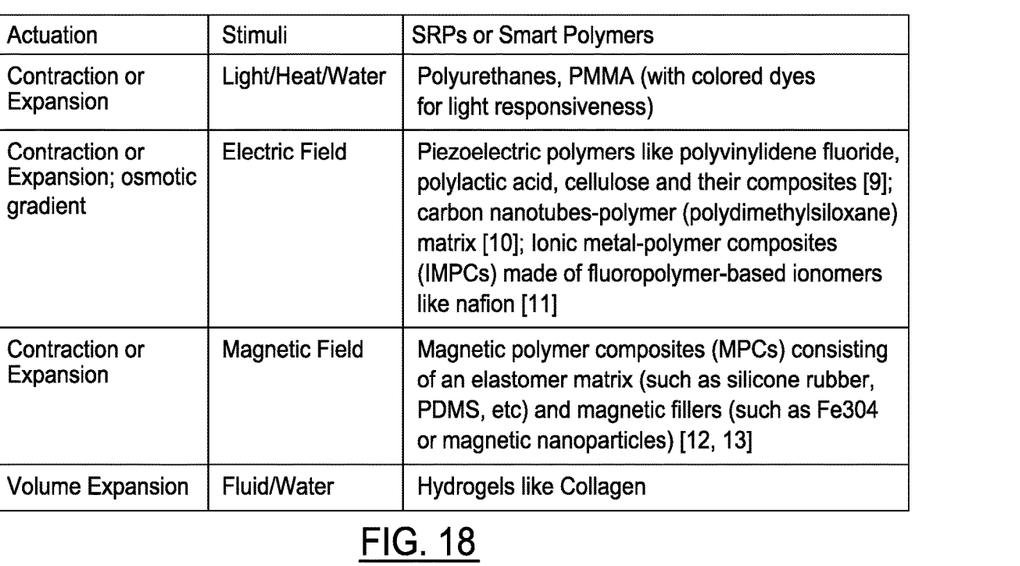
FIG. 18 is a table listing various types of materials that may be used to form the flexures discussed in the various embodiments, with it being understood that the table is not meant to be exhaustive of the types of materials that may be used.

FIG. 18 shows a table of various materials that may be used in constructing the SRP flexure 14 as a compression flexure or an expansion flexure. The substrate 12 may be formed from a wide variety of materials including, but not limited to, Polyimide, Parylene, Silicone, Graphene, as well as some thin metals such as gold, platinum or iridium.

Figure 12A:
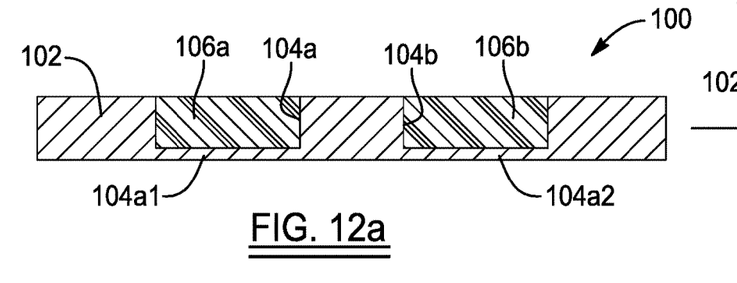
FIGS. 12a and 12b show another embodiment of a spatio-temporal, stimulus responsive foldable structure incorporating two spaced apart flexures, one being designed to exert a tensile force on the opposing substrate portions which border it, and the other flexure being designed to exert a compressive force on the substrate portions which border it, to create a structure with multiple curved sections once the structure is actuated.
Figure 12B:
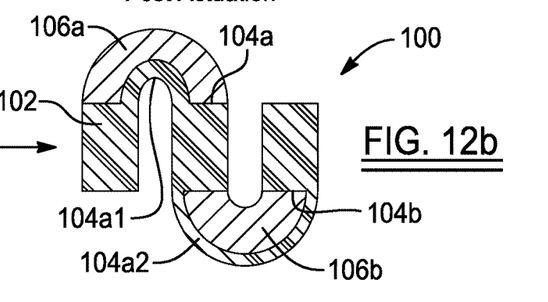

FIGS. 12a and 12b show a controllably foldable structure 100 in accordance with another embodiment of the present disclosure. The structure 100 is similar to the structure 10 in that it includes a substrate 102, but with a plurality of spaced apart engineered weakness sections 104a and 104b which are filled with SRP flexures 106a and 106b, respectively. The engineered weakness sections 104a and 104b are formed to create thin sections 104a1 and 104a2 adjacent one surface of the substrate 102. In this example the SRP flexure 106a is formed from a differential stress gradient multilayer SRP stack which effects a compressive stress action, like that described for the structure 10 shown in FIG. 9b, while the flexure 106b is formed from a differential stress gradient multilayer SRP stack that provides a tensile stress action, like that shown in FIG. 8b. When these two SRP flexures 106a and 106b are actuated, the substrate 102 is folded into an accordion-like shape.

Figure 13A:
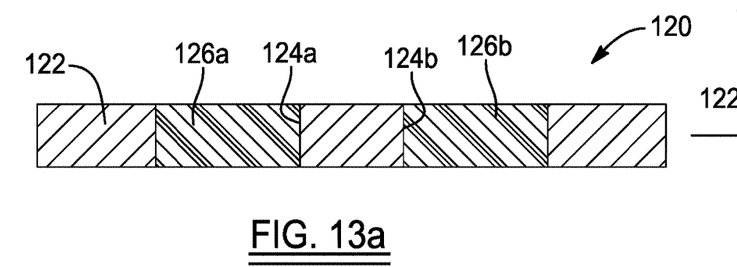
FIGS. 13a and 13b show another embodiment of a spatio-temporal, stimulus responsive foldable structure which is similar to that shown in FIGS. 12a and 12b, but wherein the flexures extend through a full thickness of the substrate, and are able to achieve the type of multi-curved structure once actuation occurs.
Figure 13B:
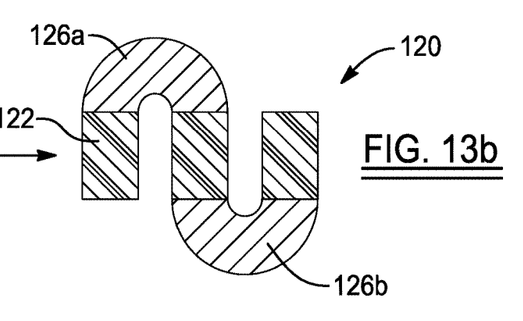

FIGS. 13a and 13b illustrate a controllably foldable structure 120 in accordance with another embodiment of the present disclosure which is somewhat similar to the structure 10' of FIG. 3. The structure 120 includes a substrate 122, but the structure 102 in this embodiment includes a plurality of full thickness openings 124a and 124b, with a first SRP flexure 126a positioned in one opening 124a and a second flexure 126b positioned in the other opening 124b. The first SRP flexure 126a in this example forms a differential stress gradient multilayer stack which effects a compressive stress action when actuated, while the second SRP flexure 126b forms a differential stress gradient multilayer stack which effects a tensile stress force when actuated. When the SRP flexures 126a and 126b are actuated, this also causes controlled bending or folding to impart an accordion-like shape to the structure 122 as shown in FIG. 13b.

Figure 14A:
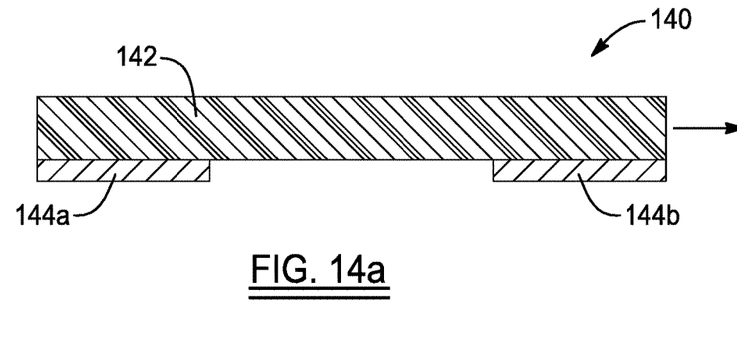
FIGS. 14a and 14b show another embodiment of a spatio-temporal, stimulus responsive foldable structure in which two flexures are placed on the same surface of a substrate, and spaced apart from one another, to produce a differently shaped curved structure once activated.
Figure 14B:
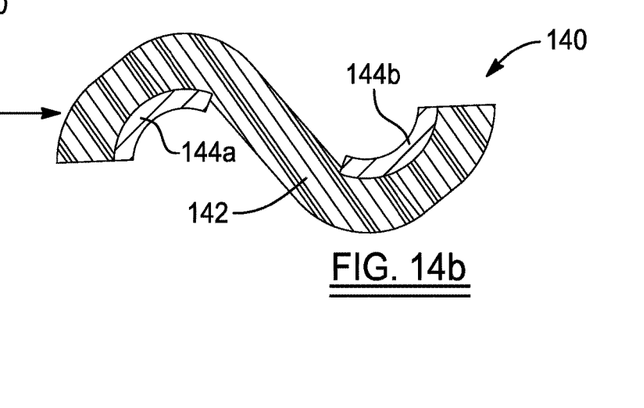

FIGS. 14a and 14b show yet another controllably foldable structure 140 somewhat similar to the structure 10" shown in FIG. 4. The structure 140 includes a substrate 142 with a surface 142a on which a plurality of spaced apart SRP flexures 144a and 144b are disposed. The SRP flexure 144a forms a differential stress gradient multilayer stack which effects a compressive stress action when actuated, while the SRP flexure 144b comprises a differential stress gradient multilayer stack which effects a tensile stress action when actuated. When the SRP flexures 144a and 144b are actuated by an appropriate predetermined stimulus, the structure 140 is folded into a modified, accordion-like shape as shown in FIG. 14b. In this embodiment, the entire substrate 142 forms or incorporates an engineered weakness to help achieve the folding action shown in FIG. 14b.

Figures 15A, 15B, 15C, 16A, 16B:
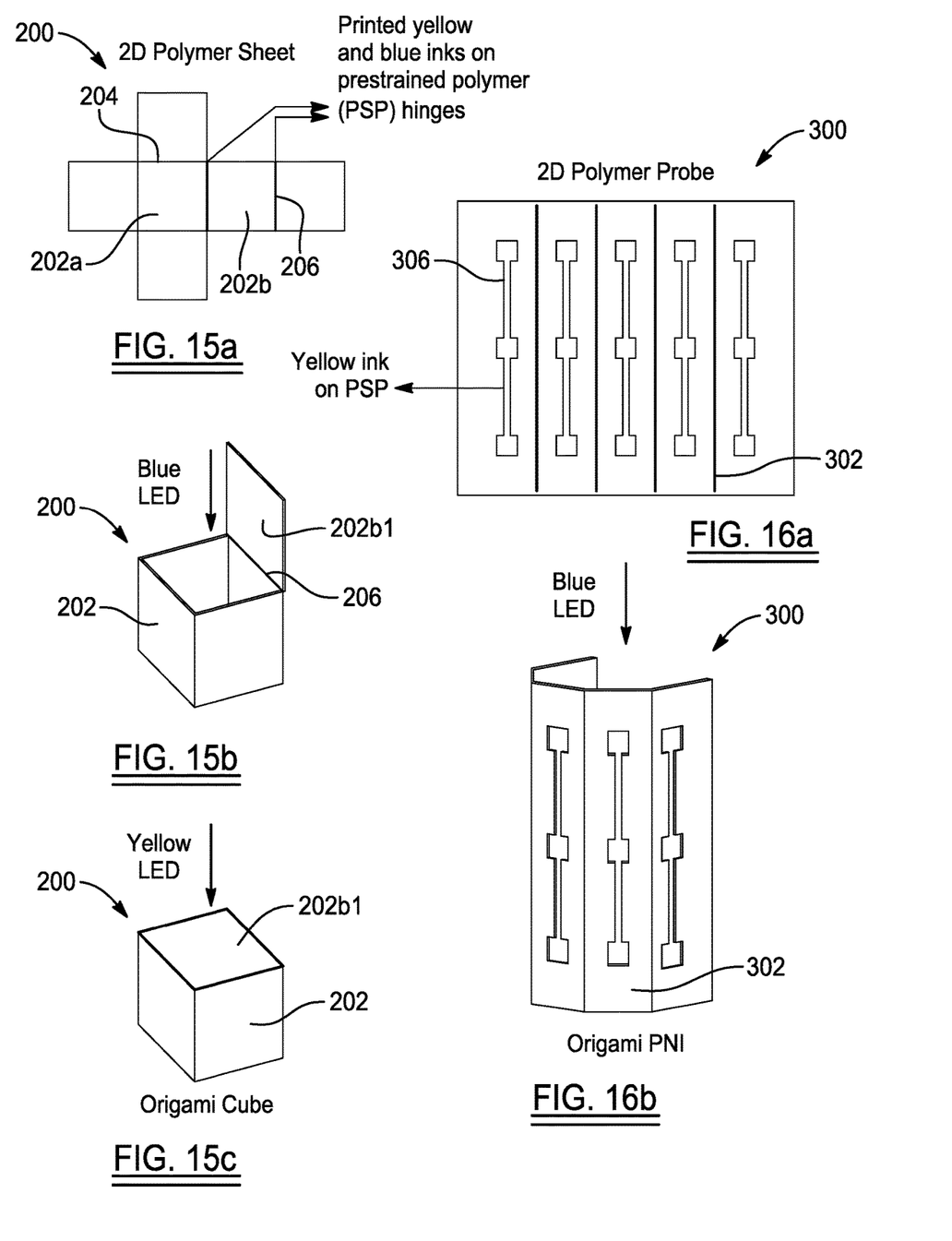
FIGS. 15a-15c show one example of the operations involved in using two different printable inks to help form two flexures on a star shaped planar substrate, where the flexures are designed to act as pre-strained hinges, and where the folding operations are performed in a manner to form a cube when the structure is actuated and fully formed into its final 3D shape.
FIGS. 16a-16b show how a plurality of flexures designed as hinges can be used to fold a planar substrate into longitudinally extending U-shape.

FIGS. 15a-15c show a structure 200 in accordance with another embodiment of the present disclosure which includes a substrate 202 having a cross shape when viewed in plan, and a first plurality of optically responsive SRP flexures 204 arranged in a general square shape to border an inner region 202a of the substrate, and a second optically response flexure 206 arranged on one extending leg 202b of the substrate. In this example, the first plurality of SRP flexures 204 is all formed using an optically responsive ink which is responsive to an optical stimulus signal having a first predetermined wavelength to effect a compressive or tensile stress. The second SRP flexure 206 is likewise formed using an optically responsive ink which is responsive to an optical stimulus signal having a second predetermined wavelength different from the first predetermined wavelength. The SRP flexures 204 and 206, in one example, may be created using a 3D printing process, for example a Direct Ink Write (DIW) 3D printing process.

FIG. 15b shows that a first stage of folding of the structure 202 occurs when the first plurality of SRP flexures 204 is actuated using a first optical stimulus signal with a first predetermined wavelength, which substantially, but not fully, forms a 3D cube. The 3D cube shape is fully realized when the SRP flexure 206 is actuated using an optical stimulus signal having the second predetermined wavelength, which results in region 202b1 being fully folded over the pre-existing cube-like structure to form the final 3D cube shape shown in FIG. 15c. And while the above description has involved using different optical signals to apply the different stimulus to actuate the flexures 204 and 206, it will be appreciated that other types of stimuli, for example and without limitation, different levels of heat, voltage, current, or different fluids, etc., could just as readily be used to selective actuate the flexures 204 and 206 in sequential fashion.

FIGS. 16a and 16b show a controllably foldable structure 300 which forms a probe when fully actuated. The probe may be used in a wide variety of applications, in one specific example as an implantable neural probe. For example, the structure 300 may be used, when fully actuated, to surround a nerve, tendon or other anatomical portion of a human body. The structure 300 includes a substrate 302 having a plurality of selectively spaced apart SRP flexures 304 positioned on or in corresponding sections of engineered weakness, and a plurality of probe elements 306 formed on the substrate. The probe elements 306 may be formed from a different material from the substrate 302, in one example a metal using an additive manufacturing operation (e.g., DIW), which allows an electrical signal to be detected and conducted to an external component (not shown). The SRP flexures 304 may in one embodiment be formed as differential stress gradient SRP flexures which create either a predetermined tensile stress or a predetermined compressive stress when actuated by a predetermined external stimulus. In one example the stimulus signal may be an optical signal having a predetermined wavelength which is directed directly at the structure 300, parallel to a longitudinal axis of each of the SRP flexures 304. When fully actuated, the SRP flexures 304 cause the substrate 302 to be folded into a general U-shape when viewed endwise, as shown in FIG. 16*b*. The actuation may be accomplished by sequentially actuating each of the SRP flexures 304 in a desired sequence, or optionally actuation could be performed simultaneously on all of the flexures 304.

It will also be appreciated that yellow, for example, reflects yellow but absorbs all other colors, such as blue. Hence, complementary ink color-wavelength pairs are ideal to initiate actuation. Yellow-blue is just one example (blue LEDs are readily available). Any other color combination can be effectively used for the same purpose. This technique is especially advantageous when there is a need to sequentially fold differently colored hinges in the same spatial location. This can be done by switching to their complementary optical wavelengths in the same sequence.

Figure 17A:
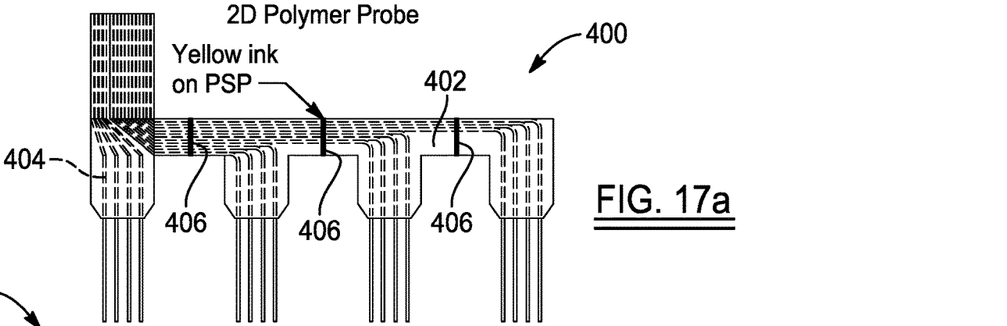
FIGS. 17a, 17b and 17c show how a plurality of flexures may be designed to create a spatio-temporal, stimulus responsive structure probe array having an alternating, folding pattern, somewhat similar to an "accordion" like shape (FIG. 17b), as well as a rectangular or square configuration (FIG. 17c), when fully actuated.
Figure 17B:
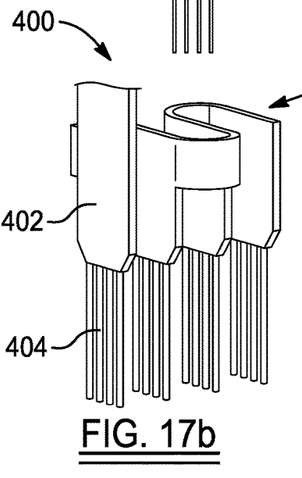
Figure 17C:
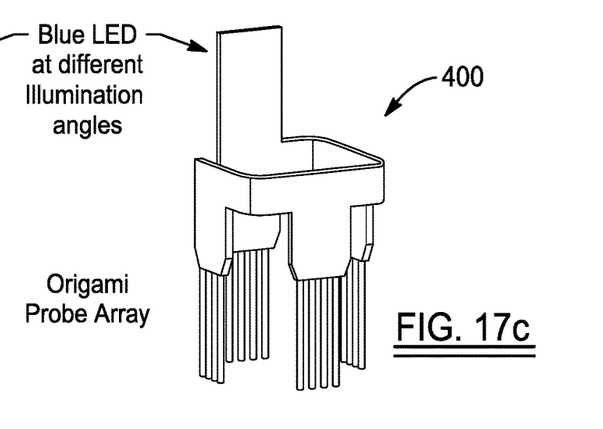

FIGS. 17*a* and 17*b* show a controllably foldable structure 400 in accordance with another embodiment of the present disclosure. The structure 400 in this example also may form a probe-like component for a specific predetermined application. The structure 400 includes a substrate 402 having a plurality of probe-like elements 404 and a plurality of spaced apart SRP flexures 406 formed in or on sections of engineered weakness in the substrate 402. The SRP flexures 406 may be formed as differential stress gradient SRP flexures which induce either a tensile or compressive stress on portions of the substrate 402 once actuated with a suitable external stimulus signal. The actuation may be carried out by applying a stimulus signal, for example an optical stimulus signal having a predetermined wavelength, at a desired incidence angle relative to the substrate 402. As with the other above-described embodiments, virtually any other suitable stimulus signal may be employed to meet the needs of a specific application. It will also be appreciated that, in general, the directionality of the light affects the bending direction of the substrate 402. The angle of light may in some instances result in uneven bending on the same side (that is, the area of the substrate that receives more light intensity may bend more).

Figure 19:
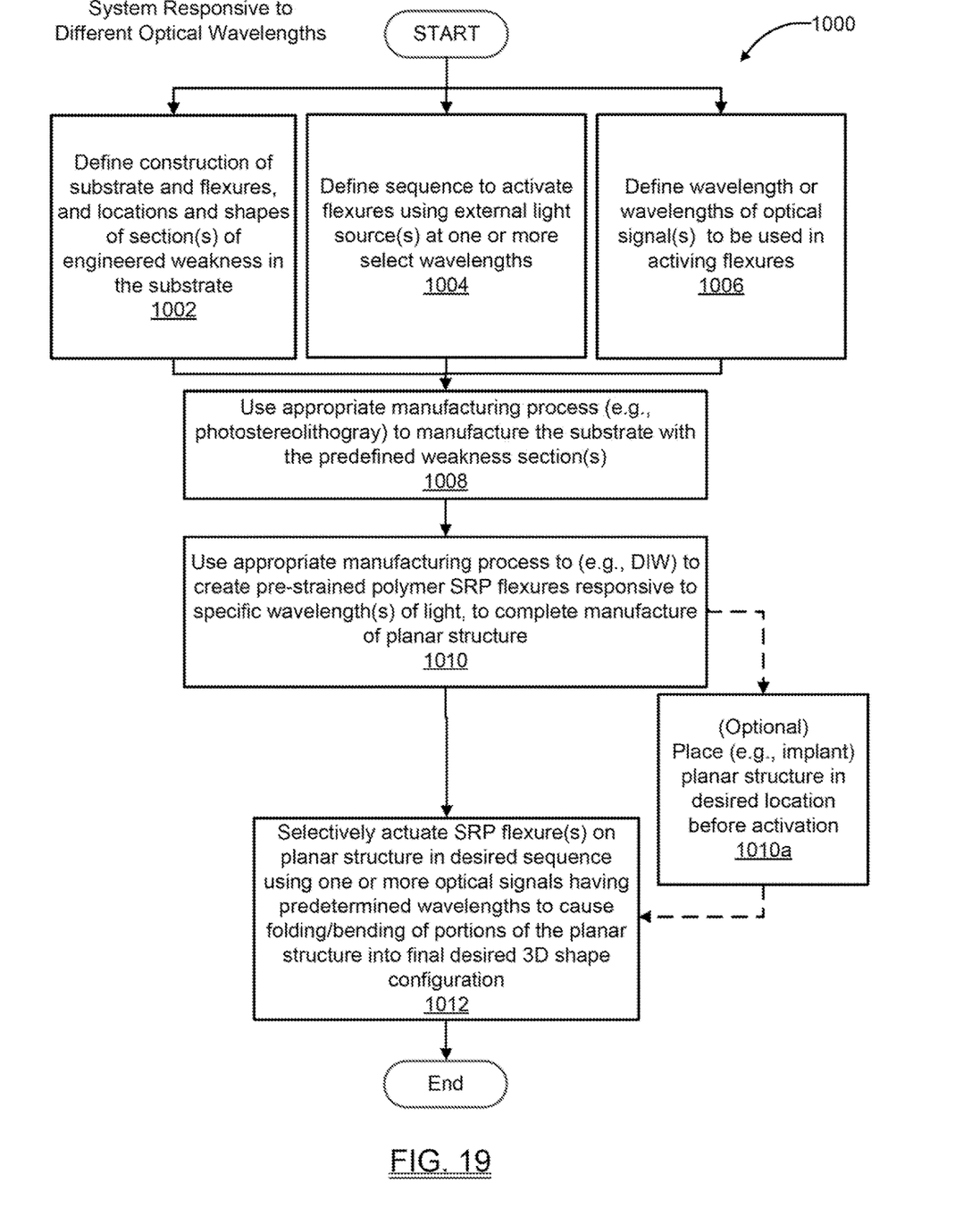
FIG. 19 is a flowchart showing one example of operations that may be performed to form a controllably foldable structure which is responsive to one or more optical signals of different wavelengths.

FIG. 19 is a flowchart 1000 illustrating one example for creating a spatio-temporal, optical stimulus responsive foldable 3D structure by using external optical signals. At operations 1002, 1004 and 1006, various design parameters are set forth for creating the structure which involve defining the construction of the substrate and the SRP flexures, as well as the shapes and locations of the sections of engineered weakness (operation 1002); defining the sequence in which to activate the SRP flexures using one or more external light sources (operation 1004); and defining the wavelength(s) to be used in activating the flexures (operation 1006).

At operation 1008 the appropriate technology is selected to manufacture the substrate using a predefined material or materials with the predefined engineered weakness sections. At operation 1010 the appropriate manufacturing process (e.g., AM process involving photostereolithography and/or DIW) is used to create the pre-strained polymer SRP flexures which are responsive to one or more specific wavelengths of light, to complete the manufacture of the structure with its substrate and the SRP flexures formed thereon.

At operation 1010*a*, which is optional, one may place the planar structure at a desired location, for example, implanted fully or partially within a portion of a human anatomy. At operation 1012 the SRP flexure(s) may be actuated. If more than one SRP flexure is present, then the actuation may be performed sequentially in the predetermined sequence, or all of the SRP flexures may be actuated at once, depending on the requirements of a specific application. In either event, the actuation causes the structure, which may be in a planar form, or generally planar form, before actuation takes place to be folded or bent into its final desired 3D shape.

While the various embodiment discussed above are not limited to microstructures, or even necessarily manufacture through additive manufacturing (AM) processes, the embodiments described herein present specific advantages in their ability to be manufactured using present day microfabrication and AM processes. Present day microfabrication processes are well suited to producing microscale structures with sub-micron features. This is particularly valuable when constructing self-folding 2D microfabricated sheets which will be actuated into 3D shapes, for example a 3D neural probe array. Such microscale and mesoscale 3D neural probes formed from 2D sheets (e.g., polyimide 2D sheets), and subsequently self-folded into 3D neural probe arrays, are expected to offer access to 3D brain volumes for high-density/high-channel count neural stimulation and recording applications.

Still further, in biomedical applications involving the implantable neural probes, it will be appreciated that the according-like 3D shapes described herein may be particularly desirable. The materials used for the substrate and the SRP flexures may further be such as to provide at least a small degree of elasticity, to enable a slight degree of stretching and contracting of the finished 3D structure. This may be advantageous in certain implantable 3D structures. For example, with peripheral cuff electrodes, a device is programmed to grasp a nerve fiber in the form of a cuff during implantation. Over time, the device will release energy and flatten the nerve which actually works well to obtain even higher quality signal data from neurons which are located more towards the center of the nerve. So, the release energy mechanism can be inhibited (such as in a neural probe example) or used to advantage (cuff electrodes).

It will also be appreciated that SRP materials have a finite lifetime after which they begin to slowly release energy. This lifetime can thus be programmed, through careful selection of SRP materials, material properties and thicknesses, used to form the SRP flexures, to vary from seconds to years. For implantable neural probe application, SRPs with a lifetime of a couple of hours will work. For example, once any type of neural device is implanted in the brain, the device is typically cemented to the skull so that it does not move over the course of time. In one application the folded turns of the finished 3D structure would remain outside the skull and would be cemented down to hold them in place, so the loss of energy of the SRP material will not be a factor in limiting a lifetime of the 3D structure.

The various embodiments of the present disclosure thus are able to combine diverse fabrication approaches including photolithography, additive manufacturing and origami methods, would is expected to expand the accessible design space across widely differing devices and technologies. Such devices and technologies which are expected to benefit from the teachings presented herein include, without limitation, high-density and high-resolution 3D versions of implantable neural arrays, optogenetic probes, energy storage devices, multiscale chemical reactors, foldable microfluidic cell culture arrays, reconfigurable electronics and circuit boards, various forms of actuators and sensors, as well as deployable systems suitable for use in defense and space applications.

The technology described herein is applicable across multiple diverse fields of interest, and the various fabrication technologies mentioned herein enable the designer to create unique and comprehensive, engineered 3D microsystems. Most significantly, the teachings of the present disclosure combine LLNL's polymer microfabrication with additive manufacturing and demonstrate the ability to synthesize and print flexures made of stimuli responsive polymers on lithographically fabricated substrates. Secondly, development of 3D geometries from 2D templates, as provided by the various embodiments described herein, are expected to pave the way to engineer high-resolution 3D device technology for a wide range of future applications. Lastly, self-folding microsystems, when engineered, can be utilized for active folding and unfolding of microsystems in variety of applications such as chemical reactors and microfluidic cell capture and release.

Although the description above contains many details and specifics, these should not be construed as limiting the scope of the invention but as merely providing illustrations of some of the presently preferred embodiments of this invention. Other implementations, enhancements and variations can be made based on what is described and illustrated in this patent document. The features of the embodiments described herein may be combined in all possible combinations of methods, apparatus, modules, systems, and computer program products. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination. Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described above should not be understood as requiring such separation in all embodiments.

Therefore, it will be appreciated that the scope of the present invention fully encompasses other embodiments which may become obvious to those skilled in the art. In the claims, reference to an element in the singular is not intended to mean "one and only one" unless explicitly so stated, but rather "one or more." All structural and functional equivalents to the elements of the above-described preferred embodiment that are known to those of ordinary skill in the art are expressly incorporated herein by reference and are intended to be encompassed by the present claims. Moreover, it is not necessary for a device to address each and every problem sought to be solved by the present invention, for it to be encompassed by the present claims. Furthermore, no element or component in the present disclosure is intended to be dedicated to the public regardless of whether the element or component is explicitly recited in the claims.

No claim element herein is to be construed under the provisions of 35 U.S.C. 112, sixth paragraph, unless the element is expressly recited using the phrase "means for." The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. A spatio-temporal stimulus responsive foldable structure, comprising:
   a substrate having at least a region formed to provide engineered weakness to help facilitate bending or folding of the substrate about the region of engineered weakness, the substrate formed to have a first shape; and
   a stimulus responsive polymer (SRP) flexure disposed at the region of engineered weakness, the SRP flexure being responsive to a predetermined stimulus actuation signal to bend or fold in response to exposure to the stimulus actuation signal, to cause the substrate to assume a second shape different from the first shape.

2. The structure of claim 1, wherein the engineered weakness in the substrate comprises a groove, and the SRP flexure is disposed in the groove.

3. The structure of claim 1, wherein the engineered weakness forms a gap in the substrate to separate the substrate into two discrete portions, and the SRP flexure is disposed in the gap.

4. The structure of claim 1, wherein the region of engineered weakness comprises an entire portion of the substrate.

5. The structure of claim 4, wherein the substrate forms a planar substrate having opposing surfaces, and the SRP flexure is disposed on at least a portion of one of the opposing surfaces.

6. The structure of claim 1, wherein the substrate further comprises at least one electrically responsive probe-like element formed thereon.

7. The structure of claim 1, wherein the first shape comprises a planar shape, and the second shape comprises a non-planar, 3D shape wherein portions of the substrate are folded to extend at least one of:
   non-parallel to one another; or
   parallel to one another.

8. The structure of claim 1, wherein the SRP flexure is responsive to an optical signal.

9. The structure of claim 8, wherein the SRP flexure is responsive to the optical signal when the optical signal has a specific predetermined wavelength.

10. The structure of claim 1, wherein the SRP flexure is responsive to at least one of:
    a thermal signal;
    a magnetic field signal;
    an electric field signal;
    a voltage signal;
    a current signal; or
    a fluid signal;
    which is applied by the predetermined stimulus actuation signal.

11. The structure of claim 1, wherein the SRP flexure is formed from a plurality of distinct layers which each respond differently to the predetermined stimulus actuation signal.

12. The structure of claim 11, wherein the plurality of distinct layers configures the SRP flexure to provide a depth differentiated response gradient in response to the stimulus actuation signal.

13. The structure of claim 1, wherein the SRP flexure is configured to produce at least one of a tensile stress or a compressive stress in response to the predetermined stimulus actuation signal.

14. The structure of claim 1, further comprising an additional SRP flexure disposed on the substrate at an additional region of engineered weakness of the structure, wherein the additional region of engineered weakness is spaced apart from the region of engineered weakness, to produce portions of the substrate which fold in opposite directions extending away from one another in response to the predetermined stimulus actuation signal.

* * * * *